United States Patent
Zenasni

(10) Patent No.: US 8,026,165 B2
(45) Date of Patent: Sep. 27, 2011

(54) PROCESS FOR PRODUCING AIR GAPS IN MICROSTRUCTURES, ESPECIALLY OF THE AIR GAP INTERCONNECT STRUCTURE TYPE FOR INTEGRATED CIRCUITS

(75) Inventor: Aziz Zenasni, Gieres (FR)

(73) Assignee: Commissariat a l'Energie Atomique, Paris (FR)

( * ) Notice: Subject to any disclaimer, the term of this patent is extended or adjusted under 35 U.S.C. 154(b) by 20 days.

(21) Appl. No.: 12/434,018

(22) Filed: May 1, 2009

(65) Prior Publication Data

US 2009/0280638 A1 Nov. 12, 2009

(30) Foreign Application Priority Data

May 6, 2008 (FR) ...................... 08 52998

(51) Int. Cl.
*H01L 21/4763* (2006.01)
(52) U.S. Cl. ........ 438/619; 438/622; 438/624; 438/637; 257/E21.581
(58) Field of Classification Search .................... 438/691, 438/622, 637, 624; 257/E21.581
See application file for complete search history.

(56) References Cited

U.S. PATENT DOCUMENTS

| | | | |
|---|---|---|---|
| 7,208,389 B1 * | 4/2007 | Tipton et al. | 438/409 |
| 7,262,503 B2 * | 8/2007 | Juengling et al. | 257/758 |
| 2004/0099952 A1 | 5/2004 | Goodner et al. | |
| 2006/0073423 A1 * | 4/2006 | Gallagher | 430/320 |
| 2006/0281295 A1 * | 12/2006 | Naujok et al. | 438/618 |

FOREIGN PATENT DOCUMENTS

EP 1 848 032 A 10/2007

OTHER PUBLICATIONS

Bailly et al., Plasma Etch and Strip in Microelectronics, 1$^{st}$ International Seminar, "Material Modifications and Surface Roughening During Porous SiOCH Etching Processes" dated Sep. 10-11, 2007, pp. 1-14.
Office Action dated Sep. 29, 2010 received in U.S. Appl. No. 12/434,007.

* cited by examiner

*Primary Examiner* — Michael Trinh
(74) *Attorney, Agent, or Firm* — Miles & Stockbridge, P.C.

(57) ABSTRACT

A process for producing at least one air gap in a microstructure,
including supplying a microstructure having at least one gap filled with a sacrificial material that decomposes starting from a temperature $\theta_1$, this gap being delimited over at least one part of its surface by a non-porous membrane, composed of a material that forms a matrix and of a pore-forming agent that decomposes at a temperature $\theta_2 < \theta_1$ by at least 20° C. and that is dispersed in this matrix, then
treating the microstructure at a temperature $\geq \theta_2$ but $<\theta_1$ in order to selectively decompose the pore-forming agent, then
treating the microstructure at a temperature $\geq \theta_1$ in order to decompose the sacrificial material.

9 Claims, 3 Drawing Sheets

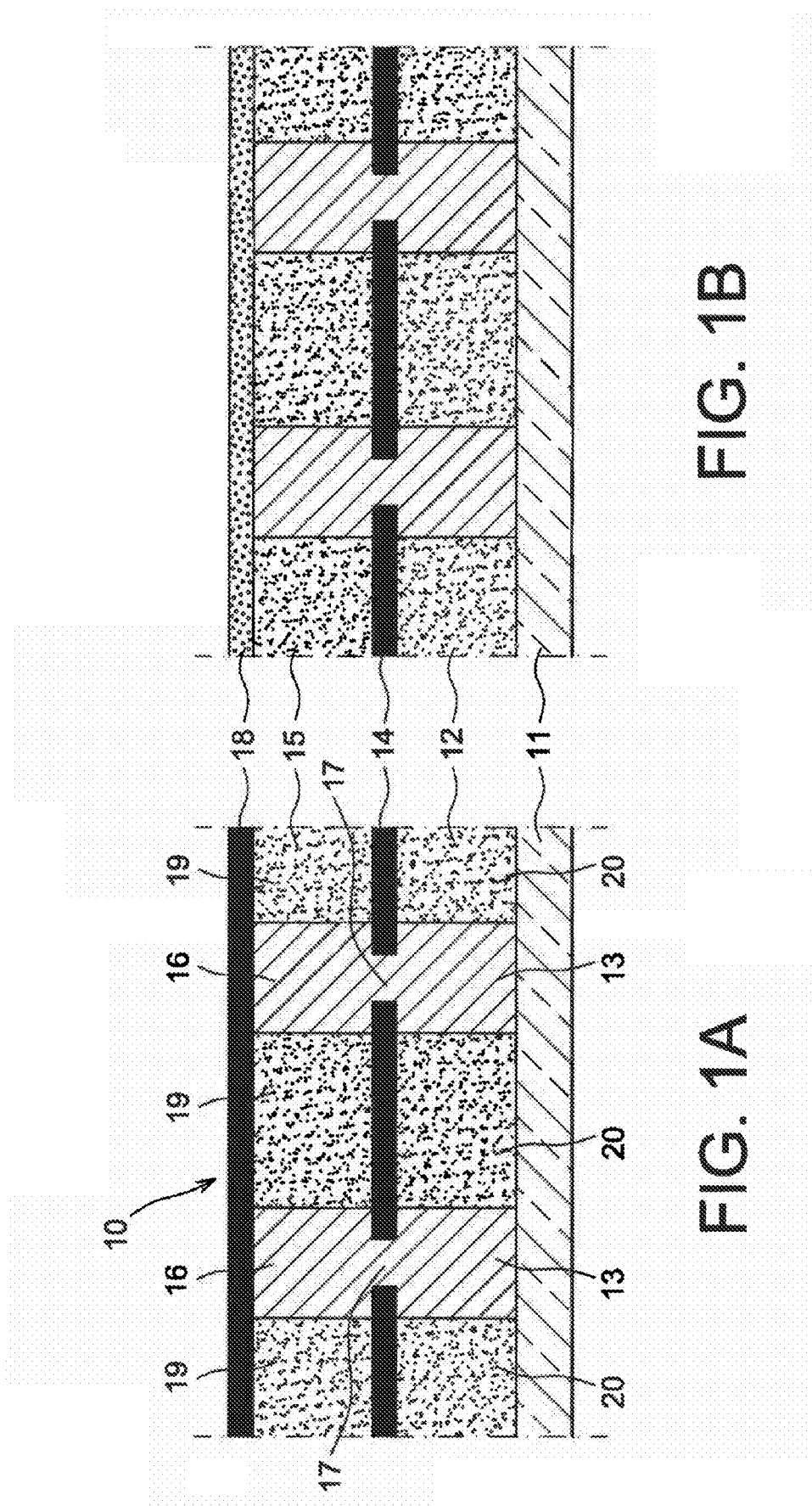

PROCESS FOR PRODUCING AIR GAPS IN MICROSTRUCTURES, ESPECIALLY OF THE AIR GAP INTERCONNECT STRUCTURE TYPE FOR INTEGRATED CIRCUITS

TECHNICAL FIELD

The present invention relates to a process for producing air gaps in microstructures.

In the foregoing and in what follows, the term "air gap" is used to denote a cavity which may be filled with air, with a gas other than air, and in particular with an inert gas such as argon, or else may be a vacuum.

The present invention is particularly capable of being used in the fabrication of air-gap interconnect structures for integrated circuits.

However, it may also be useful for producing other types of air-gap microstructures such as, for example, MEMS (microelectromechanical systems) having resonant cavities of the BAW (bulk acoustic wave) type, or else microbatteries.

PRIOR ART

One of the integration schemes used to date for producing air-gap interconnect structures for integrated circuits makes provision for inserting the metal lines of one and the same level into a layer of a sacrificial material that consists of a heat-decomposable polymer, covering the whole assembly with a dielectric membrane, then carrying out a thermal annealing, optionally assisted by UV, so as to decompose the sacrificial material, and extracting it from the structure by volatilization through the dielectric membrane.

This scheme requires the dielectric membrane to have a sufficient porosity in order to let the sacrificial material through once it has decomposed.

It has also been proposed, in order to produce this membrane, to deposit a hybrid film comprising, on the one hand, a dielectric material that forms a matrix and, on the other hand, a pore-forming agent dispersed in this matrix, and to take advantage of the thermal annealing, intended for extracting the subjacent sacrificial material, to decompose the pore-forming agent and thus convert the hybrid film into a porous dielectric film. Porous dielectric films obtained in that way are, for example, the BD2x films described by Bailly et al. (*Plasma Etch and Strip in Microelectronics*, 1$^{st}$ International Seminar, 10-11 Sep. 2007, Leuven, Belgium), which are SiCOH type films having 25% porosity.

However, experimentation shows, in this case, that at the end of the thermal annealing gaps are obtained that contain residues of sacrificial material (signalling an incomplete decomposition and an incomplete extraction of this material) and which, due to the fact that they are only partially filled with air, cannot give the structure satisfactory electrical performances.

Furthermore, this scheme can only be applied if the creation of the air gaps is carried out level by level, that is to say that the gaps of one level of interconnects are created before the metal lines of the following level of interconnects are produced.

However, this generates a certain number of stresses.

In particular, as the creation of air gaps in one level of interconnects has the effect of reducing the mechanical strength of the structure, the mechanical operations necessary for the integration of the following levels of interconnects, such as, for example, the chemical-mechanical polishing operations, are carried out whilst the structure is mechanically weakened, all the more so since air gaps are created over several layers of interconnects, which may lead to a collapse or crushing of the structure and therefore to its destruction.

Furthermore, during the etching and metallization operations necessary for producing vias, that is to say metal bridges that provide the connection between the metal lines of two adjacent levels of interconnects, a misalignment of the vias—which is a phenomenon that occurs quite commonly during the fabrication of interconnect structures—may have the effect that the etching opens into a subjacent air gap and that the metallization is then accompanied by a deposition of metal in this gap with, as a result, a faulty structure having poor electrical properties being obtained.

SUMMARY OF THE INVENTION

The invention justifiably aims to provide a process that makes it possible to produce one or more air gaps in a microstructure by extraction, through a porous membrane, of a sacrificial material that decomposes with heat, and which solves all these problems since it leads to air gaps being obtained that are devoid of residues of sacrificial material and, in the case where air gaps must be produced in several levels of one and the same microstructure, makes it possible to create these gaps only once the integration of the last one of these levels has been achieved.

This process successively comprises:

1) the supply of a microstructure comprising at least one gap filled with a sacrificial material that decomposes starting from a temperature $\theta_1$, this gap being delimited over at least one part of its surface by a non-porous membrane, composed of a material that forms a matrix and of a pore-forming agent that decomposes at a temperature $\theta_2$ at least 20° C. below $\theta_1$ and that is dispersed in this matrix;

2) the heat treatment (or annealing) of the microstructure at a temperature at least equal to $\theta_2$ but below $\theta_1$ in order to selectively decompose the pore-forming agent and thus render the membrane porous; and 3) the heat treatment of the micro-structure at a temperature at least equal to $\theta_1$ in order to decompose the sacrificial material and obtain its extraction from the gap through the membrane rendered porous in step 2), by which means an air gap is obtained in place of the gap filled with sacrificial material.

Thus, according to the invention, it is by decomposing firstly the pore-forming agent present in the non-porous membrane, then secondly the subjacent sacrificial material—which amounts to creating the porosity of the membrane before beginning the decomposition of the sacrificial material—that air gaps devoid of residues of this material are obtained.

The material that forms the matrix of the non-porous membrane may be any material, preferably based on silica, known, on the one hand, for being stable at high temperatures such as those that are conventionally used in the fabrication processes specific to the microelectronics industry, on the other hand, for being capable of being deposited in thin layers and, in the case where the microstructure is an interconnect structure for integrated circuits, for also having a low dielectric constant.

Thus, it may especially be a polymer having silica-based units of the silsesquioxane family such as a methyl silsesquioxane, a hydrogen silsesquioxane or a mixture thereof, in which case the non-porous membrane is advantageously formed by spin coating, from a solution comprising this polymer and the pore-forming agent in an organic solvent of the acetone, cyclohexanone, tetrahydrofuran, methyl ethyl ketone, isopropanol, ethyl lactate or propylene glycol monomethyl ether type.

As a variant, it may also be a non-polymeric silica-based material such as $SiO_2$, $SiO_xC_yH_z$ or $SiO_xF_y$, in which case the non-porous membrane is advantageously formed by chemical vapour deposition, also known by the acronym CVD, or by plasma enhanced chemical vapour deposition, also known by the acronym PECVD.

The pore-forming agent dispersed in this matrix may, itself, be any material that is capable of losing its structural integrity under the effect of heat and that is capable of being deposited, together with the material intended to form the matrix, by a thin-film deposition technique and, in particular, by spin coating, CVD or PECVD, so as to be present in this matrix, at the end of the deposition, in a dispersed form, advantageously in the form of nanoparticles.

Thus, it may especially be a polymer that results from the polymerization of one or more monomers having one or more ethylenically unsaturated groups chosen from:

ethylenic monomers comprising one or more —$CO_2H$ groups and esters thereof, and also ethylenic monomers comprising one or more CN groups, such as:
  optionally substituted (meth)-acrylics, such as acrylic acid, methacrylic acid or crotonic acid;
  alkyl and alkylene (meth)acrylates such as methyl, ethyl, propyl, butyl, octyl, 2-ethyl-hexyl, cyclohexyl or 2-hexene (meth)acrylates, and derivatives thereof obtained by substitution of said alkyl and alkylene groups such as methoxyethyl, ethoxyethyl, ethoxypropyl, hexafluoroisopropyl, 2-hydroxyethyl, 2-hydroxypropyl or 3-hydroxypropyl, 2,3-dihydroxypropyl, polyethoxyethyl or polyethoxy-propyl (meth) acrylates;
  aryl (meth)acrylates such as phenyl or benzyl (meth) acrylates, and derivatives thereof obtained by substitution of said aryl groups;
  (meth)acrylates and di(meth)-acrylates of poly(ethylene glycol) or of poly(propylene glycol);
  (meth)acrylamides and N-substituted derivatives thereof such as N-methylacrylamide, N,N-dimethylacrylamide, N,N-dimethylmethacrylamide, 2-acrylamido-2-methyl-1-propanesulphonic acid, N-[3-(dimethylamino)propyl]acrylamide or 2-(N,N-diethyl-amino)ethylmethacrylamide;
  unsaturated dicarboxylic acids such as maleic acid, fumaric acid or itaconic acid, and esters thereof such as dimethyl maleate, dimethyl fumarate or diethyl fumarate;
  nitrile monomers such as acrylonitrile;
ethylenic monomers comprising a heterocyclic group such as a pyridine ring (for example, 2-vinylpyridine, 4-vinylpyridine, 2-methyl-5-vinylpyridine, 4-methyl-5-vinylpyridine or N-methyl-4-vinylpyridine), a piperidine ring (for example, N-methyl-4-vinylpiperidine), an imidazole ring (for example, 2-methyl-1-vinylimidazole), a pyrrolidone ring (for example, N-vinylpyrrolidone) or else a pyrroledione ring (for example, maleimide);
ethylenic monomers comprising an exclusively hydrocarbon-based aromatic group such as styrene or α-methylstyrene;
ethylenic monomers comprising an —O—CO—R group with R representing an alkyl group (for example, vinyl acetate or vinyl propionate), or an aryl group (for example, vinyl benzoate);
ethylenic monomers comprising an —OR group, known by the terminology of vinyl ethers, with R representing an alkyl group (for example, methyl vinyl ether), said group possibly comprising one or more oxygen atoms (for example, ethoxyethyl vinyl ether) or one or more amino groups (for example, dimethylaminoethyl vinyl ether);
exclusively hydrocarbon-based ethylenic monomers such as 1-hexene or 2-hexene, norbornene, acenaphthylene or terpenes such as, α-terpinene; and
ethylenic monomers comprising a —C(O)R group with R representing an alkyl group (for example, vinyl methyl ketone.

As mentioned previously, the pore-forming agent may be a copolymer that results from the polymerization of several different ethylenic monomers, optionally in the presence of crosslinking agents such as divinylbenzene or bismaleimide. Thus, it may especially be a crosslinked styrene/divinylbenzene polymer, optionally with maleimide or bismaleimide.

Other types of pore-forming agent may also be used such as, for example, a polyamide, a polyarylene ether, a polyvinyl chloride or a multifunctional acrylate/methacrylate composite referred to as a "B-staged" composite.

As regards the sacrificial material, it may be chosen from the materials that have just been mentioned for the pore-forming agent, or else from carbon-based materials having an amorphous $C_xH_y$ structure that decompose at temperatures below 500° C. Such materials may especially be obtained by PECVD from exclusively hydrocarbon-based precursors of the methane, propane, butane, acetylene and similar type, as a mixture with one or more inert gases such as argon or nitrogen.

In accordance with the invention, it is possible to use, as the pore-forming agent and as the sacrificial material, different materials having decomposition temperatures that are at least 20° C. apart, the decomposition temperature of the pore-forming agent having to be the lower of the two.

However, for practical reasons it is preferred to use the same material and act on its deposition temperature knowing that the more a material of sacrificial type is deposited at a high temperature, the more it is advisable to apply a high temperature to it in order to decompose it and, therefore, extract it from a matrix or from a gap in which it is found.

Thus, for example, a thermal annealing of 275° C. allows poly(α-terpinene) that has been deposited by PECVD at a temperature of 200° C. to be decomposed, whereas it does not allow this material to be decomposed when it has been deposited at 250° C. by the same technique. Similarly, a thermal annealing of 350° C. allows poly(α-terpinene) that has been deposited by PECVD at a temperature of 275° C. to be decomposed, whereas it does not allow this material to be decomposed when it has been deposited at 300° C. by the same technique.

This may be taken advantage of for, for example, providing a microstructure in step 1) in which:
  the non-porous membrane comprises poly(α-terpinene) as pore-forming agent, for example in a non-polymeric silica-based matrix of $SiO_xC_yH_z$ type, which has been formed by PECVD at a temperature of around 275° C.; while
  the sacrificial material is poly(α-terpinene) that has been deposited by PECVD at a temperature of around 300° C.,
by which means step 2) of selective decomposition of the pore-forming agent may then be carried out at 350° C., while step 3) of decomposition of the sacrificial material may, itself, be carried out at a temperature of 400° C.

In all cases, the heat treatments of steps 2) and 3) are advantageously carried out under ultraviolet radiation, because experimentation has in fact shown that an irradiation by ultraviolet rays facilitates the thermal decomposition and, therefore, the extraction of the pore-forming agent and of the sacrificial material.

According to one particularly preferred arrangement of the invention, the microstructure is an interconnect structure for integrated circuits, which comprises at least one level of interconnects formed from a plurality of metal lines separated from one another by air gaps, in which case the process comprises, in the following order:

a) the deposition, onto a substrate, of the sacrificial material in the form of a layer;

b) the etching of this layer in accordance with a pattern corresponding to the arrangement that has to be presented by the metal lines in the level of interconnects;

c) the formation of metal lines in the etched zones of the sacrificial material;

d) the deposition, onto the metal lines thus formed and onto the unetched parts of the layer of sacrificial material, of the non-porous membrane;

e) the heat treatment of the micro-structure at a temperature at least equal to $\theta_2$ but below $\theta_1$; and f) the heat treatment of the micro-structure at a temperature at least equal to $\theta_1$.

In the case where this interconnect structure is designed to comprise two, three, four, etc. levels of interconnects adjacent to one another, each formed from a plurality of metal lines separated by air gaps, then:

the integration of each level of interconnects is achieved using a sacrificial material/pore-forming agent pair, the pore-forming agent of which is capable of decomposing starting from a temperature at least 20° C. below the minimum decomposition temperature of the sacrificial material, and the sacrificial material of which is capable of decomposing starting from a temperature at least 20° C. below the minimum decomposition temperature of the pore-forming agent utilised for achieving the integration of the subjacent level of interconnects; by which means:

air gaps are created, once the last level of interconnects is integrated, by treating the structure with higher and higher temperatures, optionally under UV irradiation, so as to selectively decompose the pore-forming agent, then the sacrificial material that are present in each level of interconnects, going from the level of interconnects integrated last to the level of interconnects integrated first.

Thus, for example, for an interconnect structure having two adjacent levels of interconnects, carried out in the following order are:

a) the deposition, onto a substrate, of a layer of the sacrificial material that decomposes starting from the temperature $\theta_1$ referred to below as "first sacrificial material";

b) the etching of this layer in accordance with a pattern corresponding to the arrangement that has to be presented by the metal lines in the first level of interconnects;

c) the formation of metal lines in the etched zones of the layer of the first sacrificial material;

d) the deposition, onto the metal lines thus formed and onto the unetched parts of the layer of the first sacrificial material, of the non-porous membrane containing the pore-forming agent that decomposes at the temperature $\theta_2$, referred to below as "first non-porous membrane";

e) the deposition, onto the first non-porous membrane, of a layer of a second sacrificial material that decomposes starting from a temperature $\theta_3$ at least 20° C. below $\theta_2$;

f) the etching of the layer of the second sacrificial material in accordance with a pattern corresponding to the arrangement that has to be presented by the metal lines in the second level of interconnects;

g) the formation of metal lines in the etched zones of the second sacrificial material;

h) the deposition, onto the metal lines formed in step g) and onto the unetched parts of the layer of the second sacrificial material, of a second non-porous membrane composed of a material that forms a matrix and of a pore-forming agent that decomposes starting from a temperature $\theta_4$ at least 20° C. below $\theta_3$ and that is dispersed in this matrix;

i) the heat treatment of the micro-structure at a temperature at least equal to $\theta_4$ but below $\theta_3$ in order to selectively decompose the pore-forming agent present in the second non-porous membrane;

j) the heat treatment of the micro-structure at a temperature at least equal to $\theta_3$ but below $\theta_2$ in order to selectively decompose the second sacrificial material;

k) the heat treatment of the micro-structure at a temperature at least equal to $\theta_2$ but below $\theta_1$ in order to selectively decompose the pore-forming agent present in the first non-porous membrane; and l) the heat treatment of the micro-structure at a temperature at least equal to $\theta_1$ in order to decompose the first sacrificial material.

In all cases, the layer(s) of sacrificial material typically have a thickness of 150 to 250 nm and, ideally, of around 200 nm, whilst the non-porous membrane(s) typically have a thickness of 50 to 100 nm and, ideally, of around 100 nm.

The process that has just been described has many advantages. Specifically, not only does it make it possible to obtain air gaps without a residue of sacrificial material and, in the case where air gaps must be produced in several levels of one and the same microstructure, to only create these gaps once the integration of the last of these levels is achieved, but it also has the advantage:

of being simple to implement;

of being able to be carried out entirely at temperatures below 450° C., which is very advantageous for applications that do not tolerate the use of very high temperatures;

of not using chemical etchants such as hydrofluoric acid which, in certain configurations, can deteriorate the layers adjacent to those of the sacrificial material; and of using relatively unstressed materials, which makes it possible to be free from the stress constraints observed during integrations requiring a stack of layers.

Other features and advantages of the process according to the invention will become more clearly apparent on reading the rest of the description that follows and that relates to an example of how this process is implemented.

Of course, this example is given merely to illustrate the subject matter of the invention and in no way constitutes a limitation of this subject matter.

BRIEF DESCRIPTION OF THE FIGURES

FIGS. 1A to 1E schematically illustrate a first example of how to implement the process for producing air gaps according to the invention, in the case of an interconnect structure for integrated circuits.

Figures 1C, 1D:
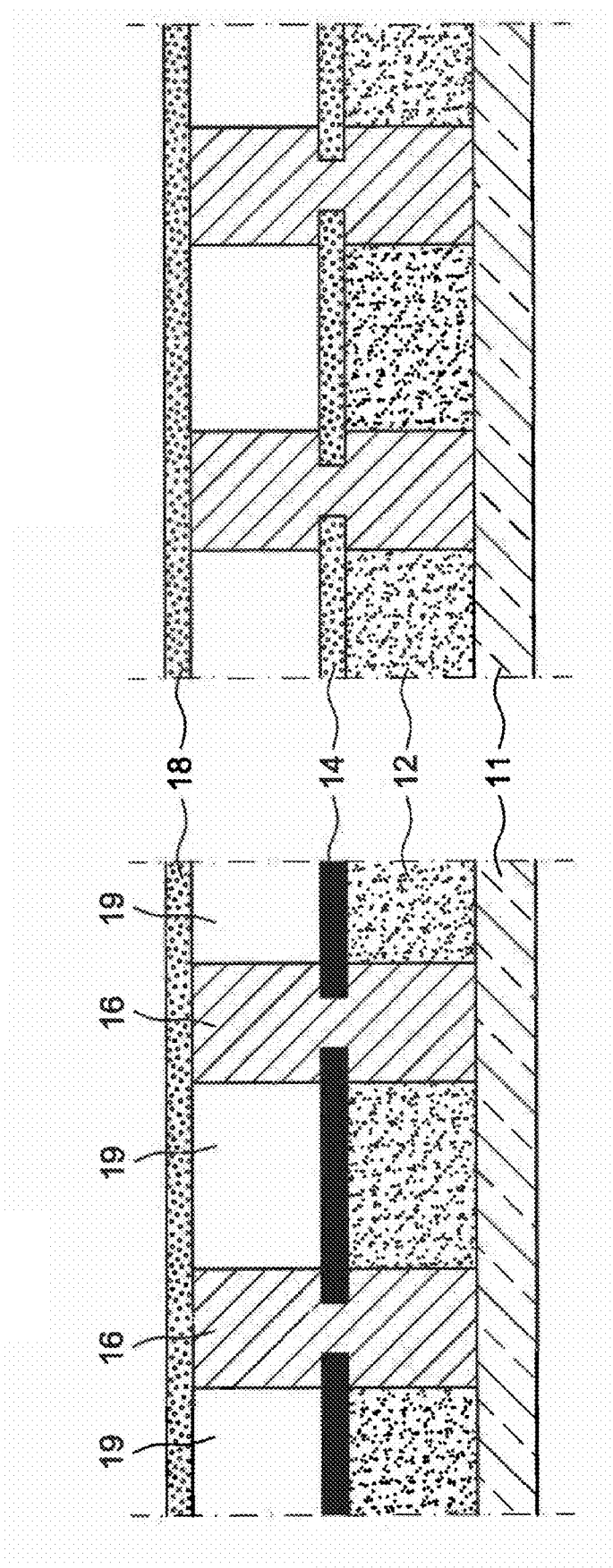

For the sake of clarity, the dimensions of the various constituents of the structure shown in these figures are not in proportion with their actual dimensions.

DETAILED DESCRIPTION OF ONE PARTICULAR EMBODIMENT

Reference is firstly made to FIGS. 1A to 1E which illustrate, in schematic form, an example of how to implement the process according to the invention in order to produce air gaps in an interconnect structure for integrated circuits.

For the sake of simplification, this structure only comprises two levels of interconnects having air gaps but it goes without saying that it could have a higher number of levels of interconnects having air gaps, for example 3, 4 or 5 levels, without changing the principle of this implementation method.

Firstly, the structure 10 shown in FIG. 1 is produced.

To do this, a first layer 12 of poly(x-terpinene) having a thickness of around 200 nm is deposited on a semiconductor substrate 11, typically made of silicon. This deposition is carried out by PECVD, starting from α-terpinene and from a carrier gas, in this case helium, for example in a capacitively coupled reactor of the Producer® SE 300 mm type from the company Applied Materials, and using the following operating parameters:

radiofrequency excitation: 13.56 MHz;
working pressure: 5 torr ($6.6 \times 10^2$ Pa);
power: 300 W;
deposition temperature: 300° C.;
α-terpinene flow rate: 1000 cm$^3$/min;
helium (carrier gas) flow rate: 500 cm$^3$/min;
deposition duration: 1 minute;
inter-electrode spacing: 0.88 cm (350 milli-inches).

Integrated into the layer 12 thus obtained are metal lines 13, typically made of copper, in order to obtain a first level of interconnects. This integration may be produced using a conventional route, i.e. for example by:

definition of a pattern of interconnects on the poly(α-terpinene) layer 12 by a lithography process using a hard mask;
etching of the poly(α-terpinene) layer 12 through the mask until the substrate 11 is revealed; and
metallization in the etching pattern and chemical-mechanical polishing.

Deposited next, onto this first level of interconnects, is a first membrane 14, having a thickness of around 100 nm, which is formed from a $SiO_xC_yH_z$ type matrix and from poly(α-terpinene) dispersed in this matrix in the form of nanoparticles. This deposition is carried out by PECVD, starting from diethoxymethylsilane, from α-terpinene and from a carrier gas, in this case helium, for example in a capacitively coupled reactor of the Producer® SE 300 mm type from the company Applied Materials, and using the following operating parameters:

radiofrequency excitation: 13.56 MHz;
working pressure: 8 torr (1.07 kPa);
power: 600 W;
deposition temperature: 275° C.;
diethoxymethylsilane flow rate: 1200° cm$^3$/min;
α-terpinene flow rate: 1350 cm$^3$/min;
helium flow rate: 500 cm$^3$/min;
deposition duration: 1 minute;
inter-electrode spacing: 0.88-cm (350 milli-inches).

After which, a second layer 15 of poly(a-terpinene) having a thickness of around 200 nm is deposited on the membrane 14 using the same process and the same operating parameters as those used for depositing the layer 12 except for the deposition temperature, which is 250° C. instead of 300° C., and the deposition duration, which is around 45 seconds.

Integrated into the layer 15 thus obtained, also using a conventional route, are metal lines 16 that are connected respectively to the metal lines 13 by means of vias 17, to obtain a second level of interconnects.

Deposited next, onto the latter, is a second membrane 18, having the same thickness as the membrane 14, which is formed from a $SiO_xC_yH_z$ type matrix and from poly(α-terpinene) dispersed in this matrix in the form of nanoparticles, the deposition of which is carried out using the same process and the same operating parameters as those used for depositing the membrane 14 except for the deposition temperature, which is 200° C. instead of 275° C., and the deposition duration, which is around 40 seconds.

Thus, the structure shown in FIG. 1A is obtained, which structure comprises:

gaps 19, filled with poly(x-terpinene), which are delimited by the metal lines 16 and the membranes 14 and 18; and
gaps 20, also filled with poly(a-terpinene), which are delimited by the electric lines 13, the substrate 11 and the membrane 14.

Then, as illustrated in FIGS. 1B to 1E, the structure 10 thus obtained is subjected to four successive annealing operations, having a duration of 30 minutes each, that are carried out under UV irradiation.

The first annealing operation is carried out at 275° C. so as to selectively decompose the poly(α-terpinene) present in the membrane 18 and thus render this membrane porous (FIG. 1B).

The second annealing operation is carried out at 300° C. in order to selectively decompose the poly(α-terpinene) layer 15, which makes it possible to convert the gaps 19 to air gaps (FIG. 1C).

The third annealing operation is carried out at 350° C. in order to selectively decompose the poly(α-terpinene) present in the membrane 14 and thus render this membrane porous (FIG. 1D), whilst the fourth annealing operation is carried out at the temperature of 400° C. in order to decompose the poly(α-terpinene) layer 12, which makes it possible to convert the gaps 20 to air gaps.

Figure 1E:
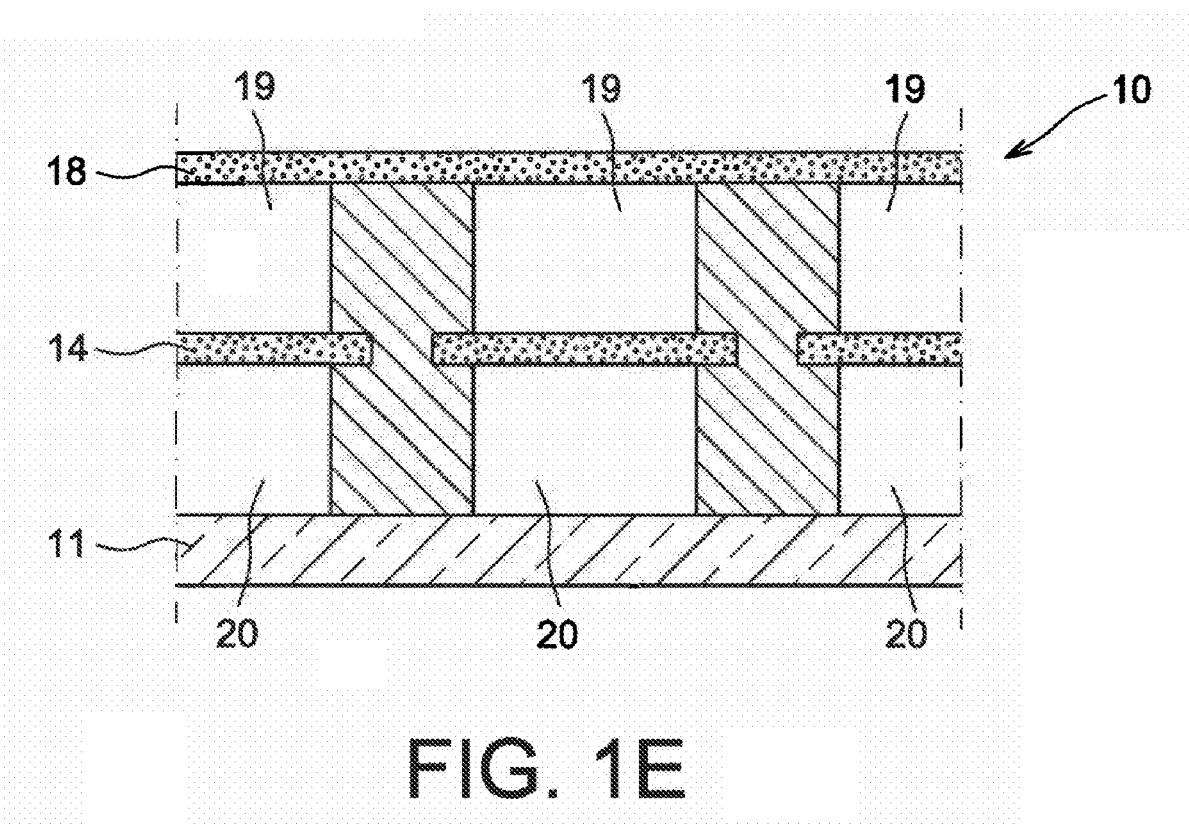

Thus, the structure 10 shown in FIG. 1E is obtained.

The invention claimed is:
1. A process for producing a microstructure for integrated circuits, said microstructure comprising first and second levels of interconnects, each said level of interconnects comprising a plurality of metal lines separated from one another by an air gap, the process comprising:

depositing, onto a substrate, a layer of a first sacrificial material that decomposes starting from a temperature $\theta_1$;
etching the layer of the first sacrificial material in accordance with a pattern corresponding to an arrangement to be presented by the metal lines in the first level of interconnects;
forming metal lines in etched zones of the layer of the first sacrificial material;
depositing, onto the metal lines thus formed and onto the unetched parts of the layer of the first sacrificial material, a first non-porous membrane composed of a material that forms a matrix and of a pore-forming agent that decomposes at a temperature $\theta_2$ at least 20° C. below $\theta_1$ and that is dispersed in said matrix;
depositing, onto the first non-porous membrane, a layer of a second sacrificial material that decomposes starting from a temperature $\theta_3$ at least 20° C. below $\theta_2$;
etching the layer of the second sacrificial material in accordance with a pattern corresponding to the arrangement to be presented by the metal lines in the second level of interconnects;

forming metal lines in the etched zones of the second sacrificial material;

depositing, onto the metal lines thus formed and onto the unetched parts of the layer of the second sacrificial material, a second non-porous membrane composed of a material that forms a matrix and of a pore-forming agent that decomposes starting from a temperature $\theta_4$ at least 20° C. below $\theta_3$ and that is dispersed in said matrix;

heating the microstructure at a temperature at least equal to $\theta_4$ but below $\theta_3$ to selectively decompose the pore-forming agent present in the second non-porous membrane, to render the second membrane porous;

heating the microstructure at a temperature at least equal to $\theta_3$ but below $\theta_2$ to selectively decompose the second sacrificial material;

heating the microstructure at a temperature at least equal to $\theta_2$ but below $\theta_1$ to selectively decompose the pore-forming agent present in the first non-porous membrane, to render the first membrane porous; and heating of the microstructure at a temperature at least equal to $\theta_1$ to decompose the first sacrificial material.

2. The process of claim 1, in which the material that forms the matrix of at least one of the first and second non-porous membranes is a silica-based polymer of the silsesquioxane family.

3. The process of claim 1, in which the material that forms the matrix of at least one of the first and second non-porous membranes is a non-polymeric silica-based material.

4. The process of claim 1, in which the pore-forming agent of at least one of the first and second non-porous membranes is a polymer that results from the polymerization of one or more monomers having one or more ethylenically unsaturated groups.

5. The process of claim 1, in which at least one of the first and second sacrificial materials is a polymer that results from the polymerization of one or more monomers having one or more ethylenically unsaturated groups, or a carbon-based material having an amorphous $C_xH_y$ structure that decomposes at a temperature below 500° C.

6. The process of claim 1, in which the pore-forming agent of at least one of the first and second non-porous membranes and of the first and second sacrificial materials are the same material.

7. The process of claim 6, in which the pore-forming agent of the first and second non-porous membranes and of the first and second sacrificial materials are poly($\alpha$-terpinene).

8. The process of claim 1, in which the microstructure heatings are carried out under ultraviolet radiation.

9. The process of claim 3, in which the material that forms the matrix of at least one of the first and second non-porous membranes is SiO2, SiOxCyHz, or SiOxFy.

* * * * *